United States Patent
Lui

(10) Patent No.: US 10,810,077 B1
(45) Date of Patent: Oct. 20, 2020

(54) RAPID SOFT-ERROR DETECTION

(71) Applicant: Ambarella International LP, Santa Clara, CA (US)

(72) Inventor: Beng-Han Lui, Santa Clara, CA (US)

(73) Assignee: Ambarella International LP, Santa Clara, CA (US)

( * ) Notice: Subject to any disclaimer, the term of this patent is extended or adjusted under 35 U.S.C. 154(b) by 217 days.

(21) Appl. No.: 16/004,645

(22) Filed: Jun. 11, 2018

(51) Int. Cl.
*G06F 11/10* (2006.01)

(52) U.S. Cl.
CPC .............................. *G06F 11/1004* (2013.01)

(58) Field of Classification Search
None
See application file for complete search history.

(56) References Cited

U.S. PATENT DOCUMENTS

| | | | | |
|---|---|---|---|---|
| 4,710,935 A * | 12/1987 | Kim | ......................... | G06F 11/10 714/801 |
| 5,173,948 A * | 12/1992 | Blackham | ................ | G06T 15/04 348/E5.055 |
| 5,548,110 A * | 8/1996 | Storch | ...................... | G06F 11/14 235/462.07 |
| 5,689,634 A * | 11/1997 | McBride | ................. | G11C 29/48 714/39 |
| 9,231,591 B1 * | 1/2016 | Lesea | ......................... | G06F 1/28 |
| 2004/0052152 A1 * | 3/2004 | Kono | ..................... | G11C 7/1066 365/233.1 |
| 2008/0208560 A1 * | 8/2008 | Johnson | ................... | G06F 21/14 703/22 |
| 2009/0037782 A1 * | 2/2009 | Hughes | ................. | G11C 29/024 714/53 |
| 2009/0144583 A1 * | 6/2009 | Bruennert | .............. | G11C 29/44 714/6.32 |
| 2015/0220532 A1 * | 8/2015 | Wong | ...................... | G16B 30/00 707/756 |
| 2015/0378621 A1 * | 12/2015 | Bruner | ................... | G06F 3/0665 711/114 |
| 2016/0134895 A1 * | 5/2016 | Suehring | .............. | H04N 19/119 375/240.01 |
| 2016/0328285 A1 * | 11/2016 | Healy | .................. | G06F 11/1008 |

OTHER PUBLICATIONS

Sridharan et al., Reducing Data Cache Susceptibility to Soft Errors, IEEE, vol. 3, Issue 4, pp. 353-364 (Year: 2006).*

* cited by examiner

*Primary Examiner* — April Y Blair
*Assistant Examiner* — Dipakkumar B Gandhi
(74) *Attorney, Agent, or Firm* — Christopher P. Maiorana, PC

(57) ABSTRACT

An apparatus includes a plurality of translation circuits, a logic circuit and a comparison circuit. The translation circuits may be configured to generate (i) a plurality of first check values by translating a plurality of input values into a codomain, and (ii) a second check value by translating an output value into the codomain. The output value may be previously generated in response to the input values and stored in a memory. The logic circuit may be configured to generate a third check value in the codomain in response to the first check values. The comparison circuit may be configured to generate an error signal by comparing the second check value with the third check value. A mismatch in the comparison may detect a corruption of the output value.

18 Claims, 10 Drawing Sheets

RAPID SOFT-ERROR DETECTION

FIELD OF THE INVENTION

The invention relates to data error detection generally and, more particularly, to a method and/or apparatus for implementing rapid soft-error detection.

BACKGROUND

A state stored in a semiconductor memory element can flip when high-energy particles hit the memory element. Although the memory elements are not damaged, the information stored in the memory elements is corrupted. The flip can cause malfunctions in a circuit that relies on the information stored in the memory element. In consumer products, users will retry operations, or even reboot the systems and the problems go away. In mission-critical systems, such events must be detected and the system must go to a safe state. In terms of a single circuit, high-energy particle events happens only rarely, much less than once a year. However, where the circuit is mass-manufactured and millions of copies exist, the cumulative errors cannot be ignored.

It would be desirable to implement rapid soft-error detection.

SUMMARY

The invention concerns an apparatus including a plurality of translation circuits, a logic circuit and a comparison circuit. The translation circuits may be configured to generate (i) a plurality of first check values by translating a plurality of input values into a codomain, and (ii) a second check value by translating an output value into the codomain. The output value may be previously generated in response to the input values and stored in a memory. The logic circuit may be configured to generate a third check value in the codomain in response to the first check values. The comparison circuit may be configured to generate an error signal by comparing the second check value with the third check value. A mismatch in the comparison may detect a corruption of the output value.

BRIEF DESCRIPTION OF THE FIGURES

Embodiments of the invention will be apparent from the following detailed description and the appended claims and drawings in which:

DETAILED DESCRIPTION OF THE EMBODIMENTS

Figure 1:
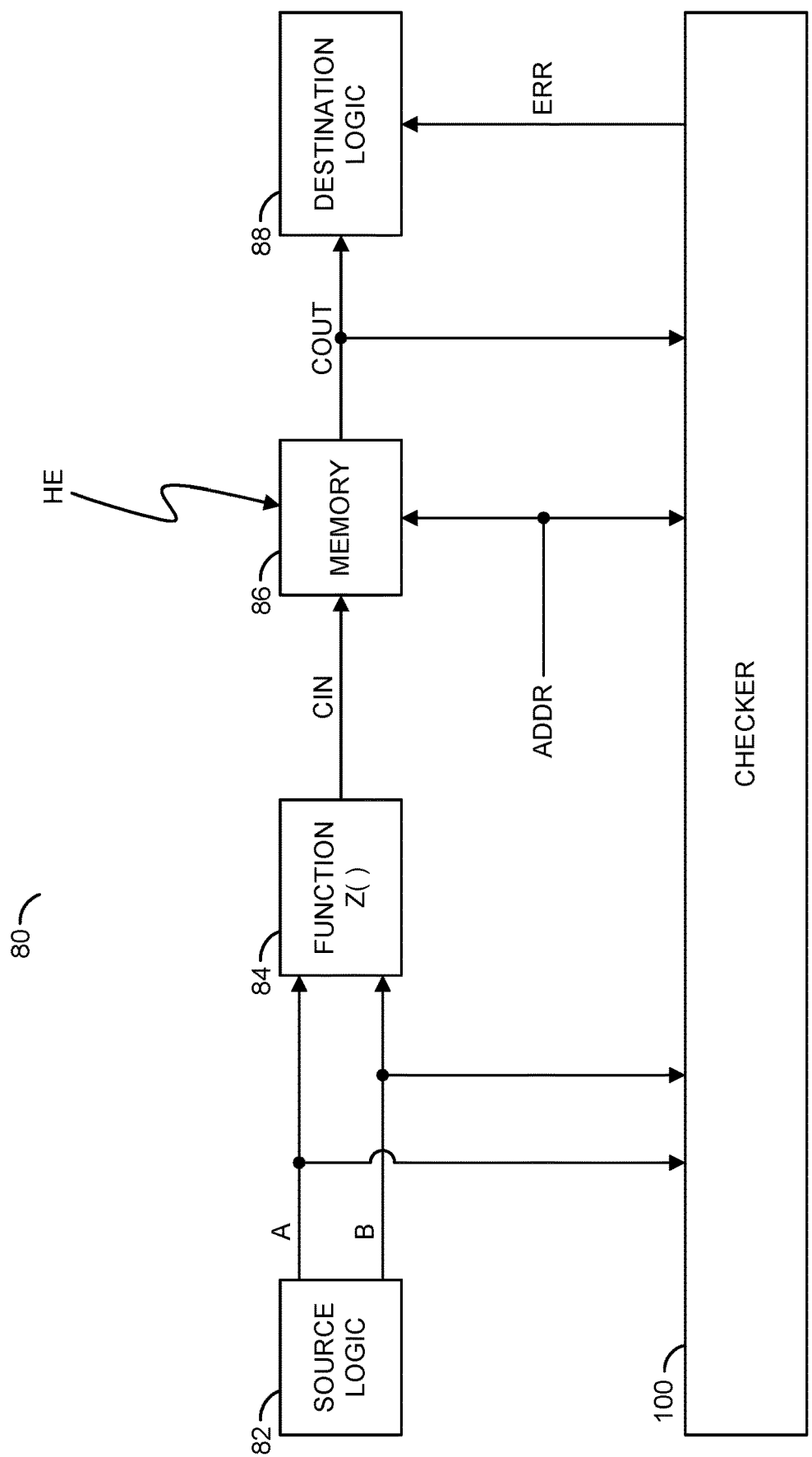
FIG. 1 is a diagram of an apparatus in accordance with an embodiment of the invention.

Embodiments of the present invention include providing rapid soft-error detection that may (i) provide arithmetic-friendly soft-error detection, (ii) be used in mission-critical timing paths, (iii) detect single bit errors of buffered data values, (iv) calculate check values in parallel with arithmetic operations that calculate the buffered data items and/or (v) be implemented as one or more integrated circuits.

Whenever a register is being written with incoming data, the data may be used calculate and store a parity bit. When the data is read from the register, the parity bit may be recalculated using the buffered value. If the recalculated parity bit differs from the originally calculated parity bit, one or more bits in the data may be flipped and an error is flagged. A binary value Y having N bits, with $y_i$ being the i-th bit, may be represented by equation 1 as follows:

$$Y = \sum_{i=0}^{N-1} 2^i \times y_i \quad (1)$$

A parity function, P( ), for the value Y may be calculated by equation 2 as follows:

$$P(Y) = \left(\sum_{i=0}^{N-1} y_i\right) \bmod 2 \quad (2)$$

In terms of hardware implementation, the mod 2 operation may be implemented with XOR logic gates for all of the incoming data bits.

Given two numbers A and B, a parity of the number Y=F(A, B) may be calculated after the values A and B have passed through the function F( ). In various embodiments, the function F( ) may be in a critical timing path of a circuit. Since the parity calculation adds logic after the function F( ), the parity calculation delay may cause timing problems. The function F( ) may be any normal arithmetic operation implemented in digital logic.

Embodiments of the invention may utilize a replacement function Q( ) for the parity function P( ), such that (1) single-bit errors in the register storing the value Y may still be detected and (2) Q(Y) may be derived from Q(A) and Q(B). Property (1) generally implies that all bits in the value Y may participate in the new parity function. Property (2) generally allows calculation the new parity for the value Y in parallel with the calculation of the value of Y itself.

Referring to FIG. 1, a diagram of an apparatus 80 is shown in accordance with an embodiment of the invention. The apparatus (or system, or device, or circuit) 80 may be implemented as part of a computer vision system. In various embodiments, the system 80 may be implemented as part of a digital video camera, a digital still camera, a hybrid digital video/still camera, a computer, a server (e.g., a cloud server), a smart phone (e.g., a cellular telephone), a personal digital assistant, or the like. In an example embodiment, the system 80 generally comprises a block (or circuit) 82, a block (or circuit) 84, a block (or circuit) 86, a block (or circuit) 88 and a block (or circuit) 100. The circuits 82-100 may be implemented in hardware, software, firmware or any combination thereof in an apparatus.

A signal (e.g., A) may be generated by the circuit 82 and transferred to the circuits 84 and 100. The signal A may carry a digital value. A signal (e.g., B) may be generated by the circuit 82 and transferred to the circuits 84 and 100. The signal B may carry another digital value. The circuit 84 may generate a signal (e.g., CIN) received by the circuit 86. The signal CIN may convey an input value. The circuit 86 may generate a signal (e.g., COUT) received by the circuits 88 and 100. The signal COUT may convey an output value. A signal (e.g., ADDR) may be received by the circuit 86 and the circuit 100. The signal ADDR may carry address values used to store the input values in the signal CIN and read the output values in the signal COUT. The circuit 100 may generate a signal (e.g., ERR) received by the circuit 88. The signal ERR may be an error signal that indicates if the output value in the signal COUT is valid or invalid (or corrupted). A signal (e.g., HE) may be received by the circuit 86. The signal HE may represent a high energy signal capable of disrupting one or more memory cells within the circuit 86 causing the data within such cells to change states.

The circuit 82 may implement a source circuit. The source circuit 82 is generally operational to generate the digital values in the signals A and B.

The circuit 84 may implement a function circuit. The function circuit 84 is generally operational to calculate the input value in the signal CIN by performing an arithmetic operation Z( ) on the digital values in the signals A and B. The arithmetic operation Z( ) may include, but is not limited to, multiplication, division, addition and subtraction.

The circuit 86 may implement a memory circuit. The memory circuit 86 is generally operational to buffer the input value received in the signal CIN at an address received in the signal ADDR. The memory circuit 86 may also be operational to present, one at a time, the values at the address as the output value in the signal COUT. In the absence of the signal HE, the output values may match the input values buffered at each address. In the presence of the signal HE, one or more bits in some output values may be different than the same bits in the input values at some addresses.

The circuit 88 may implement a destination logic circuit. The destination logic circuit 88 is generally operational to perform an operation based on the output value received in the signal COUT while the signal ERR indicates not corruption. If the signal ERR indicates that the output value in the signal COUT may be corrupted, the destination logic circuit 88 may be operational to ignore the output value in the signal COUT.

The circuit 100 may implement a checker circuit. The checker circuit 100 is generally operational to (i) generate a multiple input check values by translating the input values received in the signals A and B into a codomain, (ii) generate a output check value by translating the output value receive in the signal COUT into the codomain, (iii) generate an intermediate check value in the codomain in response to the input check values, and (iv) generate the error signal ERR by comparing the output check value with the intermediate check value. A mismatch in the comparison of the output check value and the intermediate check value may detect a corruption of the output value. The intermediate check value may be calculated in parallel with the function circuit 84 calculating the input value in the signal CIN, thus shortening the timing path until the intermediate check value is available.

Figure 2:
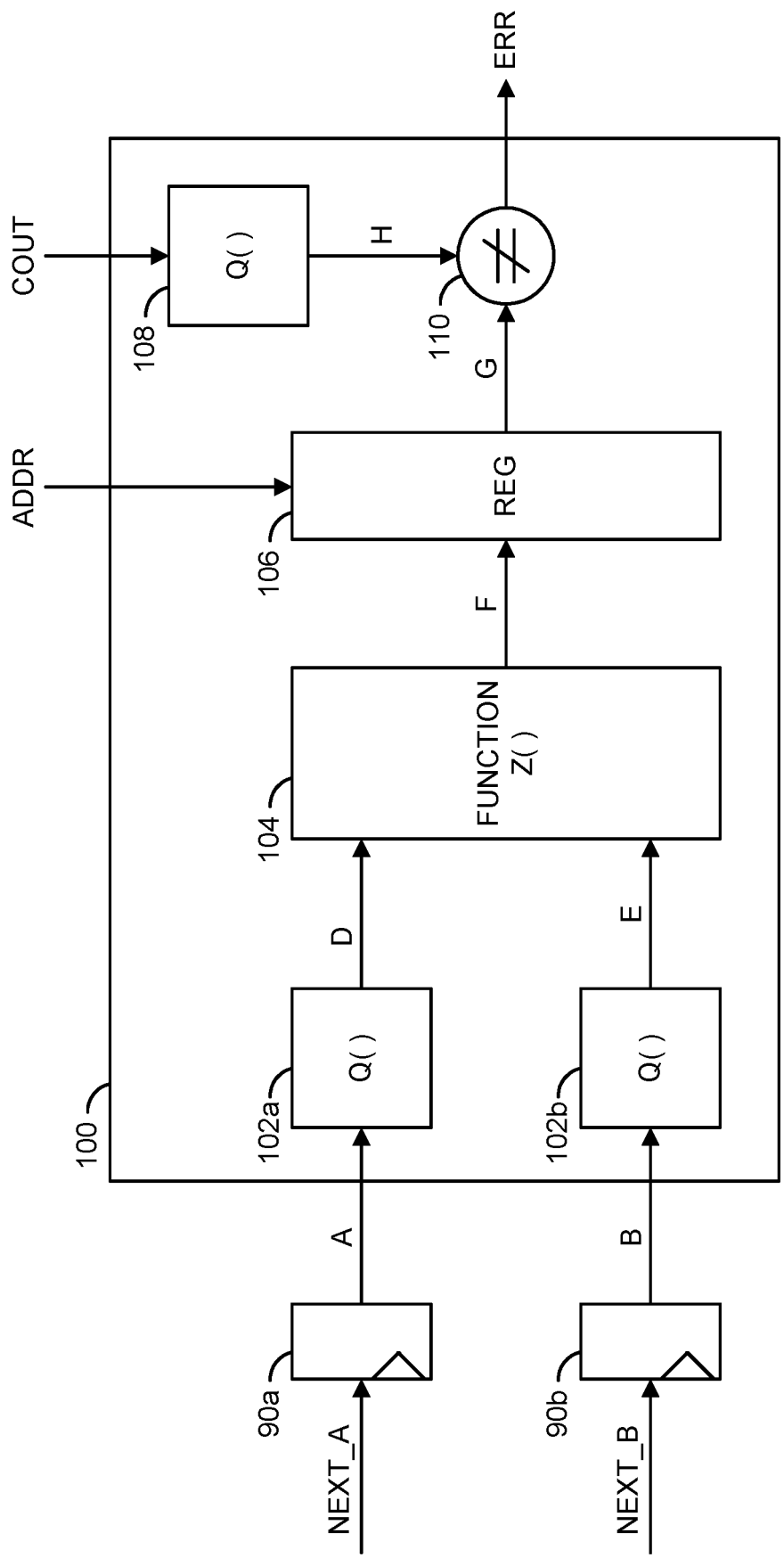
FIG. 2 is a diagram of a checker circuit in the apparatus in accordance with an embodiment of the invention.

Referring to FIG. 2, a diagram of an example implementation of the checker circuit 100 is shown in accordance with an embodiment of the invention. The checker circuit 100 generally comprises multiple blocks (or circuits) 102a-102b, a block (or circuit) 104, a block (or circuit) 106, a block (or circuit) 108 and a block (or circuit) 110. The apparatus 80 may include multiple registers (or buffers) 90a-90b.

A signal (e.g., NEXT_A) may be received by the register 90a. The signal NEXT_A may convey a next digital value to be processed by the checker circuit 100. A signal (e.g., NEXT_B) may be received by the register 90b. The signal NEXT_B may convey another next digital value to be processed by the checker circuit 100. The registers 90a-90b may present the signals A and B to the circuit 102a and 102b. The signal ADDR may be received by the circuit 106. The circuit 108 may receive the signal COUT. The signal ERR may be generated by the circuit 110.

A signal (e.g., D) may be generated by the circuit 102a and received by the circuit 104. The signal D may carry an input check value of the value received in the signal A. A signal (e.g., E) may be generated by the circuit 102b and received by the circuit 104. The signal E may carry an input check value of the value received in the signal B. A signal (e.g., F) may be generated by the circuit 104 and presented to the circuit 106. The signal F may carry an intermediate check value based on the input check values in the signals D and E. The circuit 106 may generate a signal (e.g., G) transferred to the circuit 110. The signal G may carry an intermediate check value buffered at the address in the signal ADDR. The circuit 108 may generate a signal (e.g., H) received by the circuit 110. The signal H may carry an output check value based on the output value received in the signal COUT.

Each circuit 102a-102b may implement a translation circuit. The translation circuits 102a-102b are generally operational to translate the values received in the signals A and B into the input check values by performing a codomain translation Q( ). Each codomain translation Q( ) may translate the output values of the function to fall within a constrained set of values (or elements). In an example embodiment, the constrained set may consist of the values {0, 1, 2}.

The circuit 104 may implement a function circuit. The function circuit 104 is generally operational to calculate the intermediate check value in the signal F by performing the arithmetic operation Z( ) on the input check values in the signals D and E. The arithmetic operation Z( ) may be the same arithmetic operation Z( ) performed by the function circuit 84.

The circuit 106 may implement multiple registers. The registers 106 are generally operational to buffer the intermediate check values at the address received in the signal ADDR. The registers 106 may also be operational to present the buffered intermediate check values in the signal G.

The circuit 108 may implement another translation circuit. The translation circuit 108 is generally operational to translate the output value received in the signal COUT into the output check value in the signal H by performing the codomain translation Q( ). The codomain translation Q( ) may be the same translation as performed by the translation circuits 102a-102b.

The circuit 110 may implement a comparison circuit. The comparison circuit 110 is generally operational to generate the signal ERR by comparing the output check value in the signal H with the intermediate check value in the signal G. If the output check value matches the intermediate check value, the comparison circuit 110 may generate the signal ERR in a non-error (or good) state. If the output check value does not match the intermediate check value, the comparison circuit 110 may generate the signal ERR in an error (or corrupt) state.

The codomain translation Q(Y) may be calculated by equation 3 as follows:

$$Q(Y) = \left( \sum_{i=0}^{\lceil N/2 \rceil - 1} (2y_{2i+1} + y_{2i}) \right) \bmod 3 \qquad (3)$$

Where the operation ⌈X⌉ may implement a normal ceiling function that returns the smallest integer value greater than or equal to X. The codomain of Q( ) generally includes only the three elements {0, 1, 2}. The translation Q( ) may satisfies two properties. A first property may be that all single-bit errors are detected. A second property may be that the checker function is preserved under addition.

A sum function S( ) may be defined by equation 4 as follows:

$$S(Y) = \sum_{i=0}^{\lceil N/2 \rceil - 1} (2y_{2i+1} + y_{2i}) \qquad (4)$$

Therefore, equation 3 may be rewritten as equation 5 as follows:

$$Q(Y) = (S(Y)) \bmod 3 \qquad (5)$$

Suppose the k-th bit in Y is flipped and so the value Y becomes a value Y'. The individual bits in Y' may be:

$y'_i = y_i$ if $i \neq k$ $= 1 - y_i$ if $i = k$

A difference of the two sums may be:

$S(Y) - S(Y') = 2y_k - 1$ if $k$ is even $= 4y_k - 2 = 3y_k - 3 + y_k + 1$ if $k$ is odd Therefore, $Q(Y) - Q(Y') = (S(Y) \bmod 3) - (S(Y') \bmod 3)$ $= (S(Y) - S(Y')) \bmod 3$ $= (2y_k - 1) \bmod 3$ if $k$ is even $= (y_k + 1) \bmod 3$ if $k$ is odd Table 1 generally lists all (e.g., 4) possible cases of the difference of Q(Y)−Q(Y'). None of the cases may result in a zero value. A difference of zero generally means that an error would go undetected. Since the difference is never zero, the checker function may always detect a single-bit error.

TABLE 1

|  | k is even | k is odd |
|---|---|---|
| $y_k$ is 0 | 2 | 1 |
| $y_k$ is 1 | 1 | 2 |

The checker function may be preserved under addition. For all n in the set of N, if $0 \leq A < 4^n$ and $0 \leq B < 4^n$, consider equation 6 as an example:

$$Q(A+B) = (Q(A) + Q(B)) \bmod 3 \qquad (6)$$

Further consider a property of Q( ) that Q(4X)=Q(X), per the definition of S( ) in equation 4. Multiplying the binary value X by 4 is the same as a left shift of the binary value X by 2 bits, and so the sum does not change (e.g., S(4X)=S(X)). Furthermore, if $0 \leq V < 4$, per equation 7:

$Q(4U+V) = (S(4U+V)) \bmod 3$ $= (S(4U) + S(V)) \bmod 3 \qquad (7)$

A sum of 4U+V may be the concatenation of the bits of U and V Because Q(4U)=Q(U), equation 7 may be rewritten as equation 8 as follows:

$Q(4U+V) = ((S(4U) \bmod 3) + (S(V) \bmod 3)) \bmod 3 =$ $(Q(4U) + Q(V)) \bmod 3$ $= (Q(U) + Q(V)) \bmod 3 \qquad (8)$ By the same concatenation reasoning, if $0 \leq V < 4^k$, equation 8 may be generalized to equation 9 as follows:

$$Q(4^k \times U + V) = (Q(U) + Q(V)) \bmod 3 \qquad (9)$$

For the case where n=1, that is, $0 \leq A < 4$, and $0 \leq B < 4$, Table 2 may list all (e.g., 16) possible cases, and conclude that equation 6 holds in the case.

TABLE 2

| A | B | Y | Q(Y) | (Q(A) + Q(B)) mod 3 |
|---|---|---|---|---|
| 0 | 0 | 0 | 0 | (0 + 0) mod 3 = 0 |
| 0 | 1 | 1 | 1 | (0 + 1) mod 3 = 1 |
| 0 | 2 | 2 | 2 | (0 + 2) mod 3 = 2 |
| 0 | 3 | 3 | 0 | (0 + 0) mod 3 = 0 |
| 1 | 0 | 1 | 1 | (1 + 0) mod 3 = 1 |
| 1 | 1 | 2 | 2 | (1 + 1) mod 3 = 2 |
| 1 | 2 | 3 | 0 | (1 + 2) mod 3 = 0 |
| 1 | 3 | 4 | 1 | (1 + 0) mod 3 = 1 |
| 2 | 0 | 2 | 2 | (2 + 0) mod 3 = 2 |
| 2 | 1 | 3 | 0 | (2 + 1) mod 3 = 0 |
| 2 | 2 | 4 | 1 | (2 + 2) mod 3 = 1 |
| 2 | 3 | 5 | 2 | (2 + 0) mod 3 = 2 |
| 3 | 0 | 3 | 0 | (0 + 0) mod 3 = 0 |
| 3 | 1 | 4 | 1 | (0 + 1) mod 3 = 1 |
| 3 | 2 | 5 | 2 | (0 + 2) mod 3 = 2 |
| 3 | 3 | 6 | 0 | (0 + 0) mod 3 = 0 |

Assume that equation 6 may be true for a certain n=k (e.g., $0 \leq A < 4^k$ and $0 \leq B < 4^k$). If $0 \leq X < 2 \times 4^k$, equation 6 may be rewritten as equation 10 as follows:

$$Q(X + 4^k) = (Q(X) + Q(4^k)) \bmod 3 \qquad (10)$$

By the existence and uniqueness of Euclidean division, X may be written as $X = X_q \times 4^k + X_r$, where the quotient $0 \leq X_q < 2$, and the remainder $0 \leq X_r < 4^k$. By substituting $X_q \times 4^k + X_r$ for X, equation 11 may be shown to be the same as equation 10 as follows:

$Q(X + 4^k) = Q((X_q + 1) \times 4^k + X_r)$ $= (Q(X_q + 1) + Q(X_r)) \bmod 3$ $= (Q(X_q) + Q(1) + Q(X_r)) \bmod 3$ $= (Q(X_q) + Q(X_r) + Q(4^k)) \bmod 3$ $= (Q(X_q \times 4^k + X_r) + Q(4^k)) \bmod 3$ $= (Q(X) + Q(4^k)) \bmod 3 \qquad (11)$ If $0 \leq X < 2 \times 4^k$ and $0 \leq Y < 4$, equation 6 may be rewritten as equation 12 as follows:

$$Q(X+Y) = (Q(X) + Q(Y)) \bmod 3 \quad (12)$$

If the condition $0 \leq X < 4^k$ is true, equation 6 is true per the assumption. Otherwise, if $X \geq 4^k$, equation 13 may be used. Let $X = 4^k + X_r$, where $0 \leq X_r < 4^k$. Equation 13 may be shown to be the same as equation 12 as follows:

$$Q(X+Y) = Q(4^k + X_r + Y)$$

$$= (Q(4^k) + Q(X_r + Y)) \bmod 3$$

$$= (Q(4^k) + Q(X_r) + Q(Y)) \bmod 3$$

$$= (Q(4^k + X_r) + Q(Y)) \bmod 3$$

$$= (Q(X) + Q(Y)) \bmod 3 \quad (13)$$

By the existence and the uniqueness of the solution to Euclidean division:

$$A = A_q \times 4 + A_r; \text{ where } 0 \leq A_q < 4^k, \text{ and } 0 \leq A_r < 4$$

$$B = B_q \times 4 + B_r; \text{ where } 0 \leq B_q < 4k, \text{ and } 0 \leq B_r < 4$$

Thus, equation 6 may be rewritten as equation 14 as follows:

$$Q(A+B) = Q((A_q + B_q) + (A_r + B_r)) \quad (14)$$

Note that $0 \leq A_q + B_q < 2 \times 4^k - 1$, and $0 \leq A_r + B_r < 8$. If $0 \leq A_r + B_r < 4$, equation 15 may be shown to be the same as equation 6 as follows:

$$Q(A+B) = Q(4 \times (A_q + B_q) + (A_r + B_r))$$

$$= (Q(A_q + B_q d) + Q(A_r + B_r)) \bmod 3$$

$$= (Q(A_q) + Q(B_q) + Q(A_r) + Q(B_r)) \bmod 3$$

$$= (Q(A_q \times 4 + A_r) + Q(B_q \times 4 + B_r)) \bmod 3$$

$$= (Q(A) + Q(B)) \bmod 3 \quad (15)$$

If $4 \leq A_r + B_r < 8$, let $A_r + B_r = 4 + C$, where $0 \leq C < 4$, equation 16 may be shown to be the same as equation 6 as follows:

$$Q(A+B) = Q(4 \times (A_q + B_q) + (A+B))$$

$$= Q(4 \times (A_q + B_q + 1) + C)$$

$$= (Q(A_q + B_q + 1) + Q(C)) \bmod 3$$

$$= (Q(A_q + B_q) + Q(1) + Q(C)) \bmod 3$$

$$= (Q(A_q + B_q) + Q(4 + C)) \bmod 3$$

$$= (Q(A_q + B_q) + Q(A_r + B_r)) \bmod 3$$

$$= (Q(A_q) + Q(B_q) + Q(A_r) + Q(B_r)) \bmod 3$$

$$= (Q(A_q \times 4 + A_r) + Q(B_q \times 4 + B_r)) \bmod 3$$

$$= (Q(A) + Q(B)) \bmod 3 \quad (16)$$

Therefore, if equation 6 is true for n=k, equation 6 may also be true for n=k+1. By mathematical induction, equation 6 is true for any range of A and B, and thus equation 6 is true.

The checker function may be preserved under multiplication. Consider equation 17 as follows:

$$Q(A \times B) = (Q(A) \times Q(B)) \bmod 3 \quad (17)$$

If $0 \leq A < 4$ and $0 \leq B < 4$, Table 3 may list of all (e.g. 16) possibilities.

TABLE 3

| A | B | Y | Q(Y) | (Q(A) × Q(B)) mod 3 |
|---|---|---|------|---------------------|
| 0 | 0 | 0 | 0 | (0 × 0) mod 3 = 0 |
| 0 | 1 | 0 | 0 | (0 × 1) mod 3 = 0 |
| 0 | 2 | 0 | 0 | (0 × 2) mod 3 = 0 |
| 0 | 3 | 0 | 0 | (0 × 0) mod 3 = 0 |
| 1 | 0 | 0 | 0 | (1 × 0) mod 3 = 0 |
| 1 | 1 | 1 | 1 | (1 × 1) mod 3 = 1 |
| 1 | 2 | 2 | 2 | (1 × 2) mod 3 = 2 |
| 1 | 3 | 3 | 0 | (1 × 0) mod 3 = 0 |
| 2 | 0 | 0 | 0 | (2 × 0) mod 3 = 0 |
| 2 | 1 | 2 | 2 | (2 × 1) mod 3 = 2 |
| 2 | 2 | 4 | 1 | (2 × 2) mod 3 = 1 |
| 2 | 3 | 6 | 0 | (2 × 0) mod 3 = 0 |
| 3 | 0 | 0 | 0 | (0 × 0) mod 3 = 0 |
| 3 | 1 | 3 | 0 | (0 × 1) mod 3 = 0 |
| 3 | 2 | 6 | 0 | (0 × 2) mod 3 = 0 |
| 3 | 3 | 9 | 0 | (0 × 0) mod 3 = 0 |

Assume that equation 17 may be true for a certain n=k such that $0 \leq A < 4^n$ and $0 \leq B < 4^n$. By the existence and the uniqueness of the solution to Euclidean division:

$$A = A_q \times 4 + A_r; \text{ where } 0 \leq A_q < 4^k, \text{ and } 0 \leq A_r < 4$$

$$B = B_q \times 4 + B_r; \text{ where } 0 \leq B_q < 4k, \text{ and } 0 \leq B_r < 4$$

Thus, equation 18 may be shown to be the same as equation 17 as follows:

$$Q(A \times B) = Q((A_q \times 4 + A_r) \times (B_q \times 4 + B_r))$$

$$= Q(16 A_q B_q + 4(A_q B_r + A_r B_q) + A_r B_r)$$

$$= (Q(16 A_q B_q) + Q(4(A_q B_r + A_r B_q)) + Q(A_r B_r)) \bmod 3$$

$$= (Q(A_q B_q) + Q(A_q B_r) + Q(A_r B_q) + Q(A_r B_r)) \bmod 3$$

$$= (Q(A_q) \times Q(B_q) + Q(A_q) \times Q(B_r) + Q(A_r) \times Q(B_q) + Q(k) \times Q(B_r)) \bmod 3$$

$$= ((Q(A_q) + Q(A_r)) \times (Q(B_q) + Q(B_r))) \bmod 3$$

$$= ((Q(4 \times A_q + A_r)) \times (Q(4 \times B_q + B_r))) \bmod 3$$

$$= (Q(A) \times Q(B)) \bmod 3 \quad (18)$$

Therefore, if equation 17 is true for n=k, equation 17 may also true for n=k+1. By mathematical induction, equation 17 may be true for any range of A and B.

Figure 3:
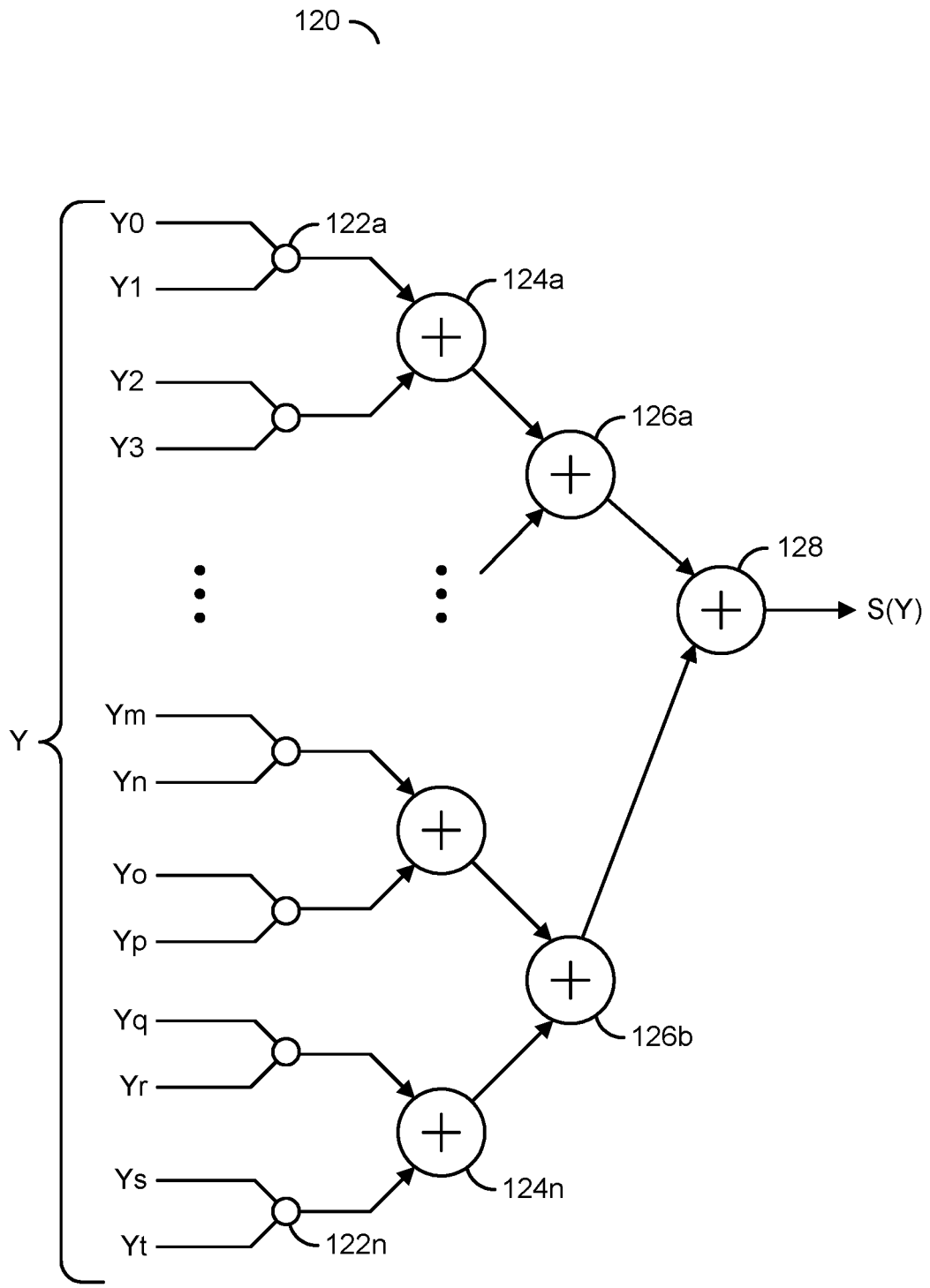
FIG. 3 is a diagram of a summation circuit in the checker circuit in accordance with an embodiment of the invention.

Referring to FIG. 3, a diagram of an example implementation of a summation circuit 120 is shown in accordance with an embodiment of the invention. One or more copies of the summation circuit 120 may be used in implementing the translation circuits 102a, 102b and 108. The summation circuit 120 generally comprises multiple concatenation circuits 122a-122n, multiple addition circuit 124a-124n, multiple addition circuits 126a-126b and an addition circuit 128.

An input value Y may be received by the concatenation circuits 122a-122n. The input value Y generally comprises multiple bits Y0-Yt. Each concatenation circuit 122a-122n may receive two bits Y0-Yt of the input value Y and generate corresponding concatenated bits. The addition circuit 128 may generate the sum value S(Y).

From equation 1 and equation 3, the calculation of a value Q(Y) may be a modulo 3 of the value S(Y). Calculating the value S(Y) may be implemented as follows. From equation 3, the term $2y_{2i+1} + y_{2i}$ may be the concatenation of the (2i+1)-th bit and the 2i-th bit. The concatenation forms a two-bit number out of two neighboring bits from Y. Therefore, the equation 3 may be implemented by chopping the number Y into chunks of 2 bits each, and adding up all the chunks with the circuits 122a-128.

However, the modulo 3 may be expensive even for a moderately small value Y. Consider equation 19 as follows:

$$Q(S(Y))= \qquad (19)$$

If equation 19 is true, the cost of the modulo 3 operation may be contained. Table 4 generally illustrates the number of bits in the value Y versus the number of bits in the sum value S(Y).

TABLE 4

| Bits in Y | 1 | 2 | 3 to 5 | 6 to 10 | 11 to 21 | 22 to 42 | 43 to 85 | 86 to 170 | 171 to 341 | 342 to 682 | 683 to 1362 |
|---|---|---|---|---|---|---|---|---|---|---|---|
| Bits in S (Y) | 1 | 2 | 3 | 4 | 5 | 6 | 7 | 8 | 9 | 10 | 11 |

Figure 4:
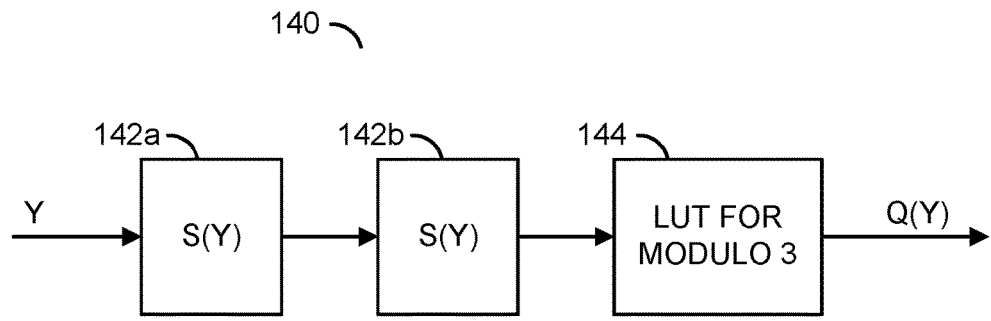
FIG. 4 is a diagram of a translation circuit in the checker circuit in accordance with an embodiment of the invention.

Referring to FIG. 4, a diagram of an example implementation of a translation circuit 140 is shown in accordance with an embodiment of the invention. The translation circuit 140 may be representative of the translation circuits 102a-102b and 108. The translation circuit 140 generally comprises multiple (e.g., 2) summation circuits 142a-142b and a lookup table (LUT) 144. Each summation circuit 142a-142b may be an instantiation (or copy) of the summation circuit 120. The value Y may be received by the summation circuit 142a. A check value Q(Y) may be generated by the LUT 144.

If $0 \leq Y < 4$, the value Y=S(Y) and so Q(Y)=Q(S(Y)). Assume that equation 19 may be true for certain n=k, such that $0 \leq Y < 4n$. Consider a case where n=k+1. By the existence and the uniqueness of the solution to Euclidean division:

$Y = Y_q \times 4 + Y_r$, where $0 \leq Y_q < 4^k$, and $0 \leq Y_r < 4$. Substituting $Y = Y_q \times 4 + Y_r$ results in equation 20. Equation 20 may be reduced to equation 19 follows:

$$Q(S(Y)) = Q(S(Y_q \times 4 + Y_r))$$

$$= Q(S(Y_q) + S(Y_r)), \text{ where } Y_q \times 4 + Y_r \text{ may be the concatenation of } Y_q \text{ and } Y_r$$

$$= (Q(S(Y_q)) + Q(S(Y_r))) \bmod 3$$

$$= (Q(Y_q) + Q(Y_r)) \bmod 3$$

$$= Q(4 \times Y_q + Y_r)$$

$$= Q(Y) \qquad (20)$$

Therefore, if Equation 19 is true for n=k, equation 19 is also true for n=k+1. By mathematical induction, equation 19 is true for any range of Y. If Y is a number with N bits, S(Y) may be a number with $\lceil \log 2(3N+1) \rceil - 1$ bits, see Table 4 for some examples. Therefore, the operation S(Y) performed by the summation circuit 142a may compress the range of the value Y aggressively. For practical purposes, the value Y may be less than a large number (e.g., 600) of bits. In such cases, the operation S(S(Y)) performed by the summation circuit 142b may be less than a small number (e.g., 4) of bits. Thus, the lookup table circuit 144 for a modulo 3 may be implemented with a few (e.g., 16) entries.

For values Y with a smaller number of bits, a single summation circuit 142a may suffice to reduce the number of bits indexing the LUT 144. For values Y with a larger number of bits, a third summation circuit may be added in series with the summation circuits 142a-142b.

Figure 5:
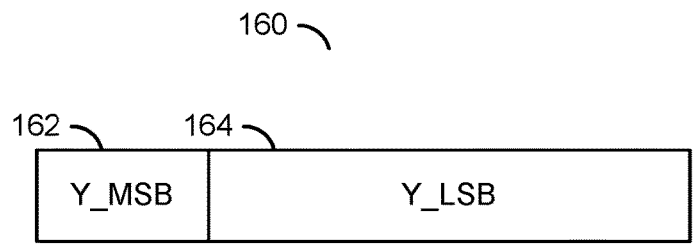
FIG. 5 is a diagram of a two's complement value in accordance with an embodiment of the invention.

Referring to FIG. 5, a diagram of an example implementation 160 of a two's complement value Y is shown in accordance with an embodiment of the invention. The value Y may comprise a most significant bit 162 (Y_MSB) and multiple less significant bits 164 (Y_LSB). If the most significant bit 162 is 0, the value Y may be considered positive and Y=Y_LSB. If the most significant bit 162 is 1, the value Y may be considered negative and Y=Y_LSB−$2^{N-1}$, where N is the number of bits.

Figure 6:
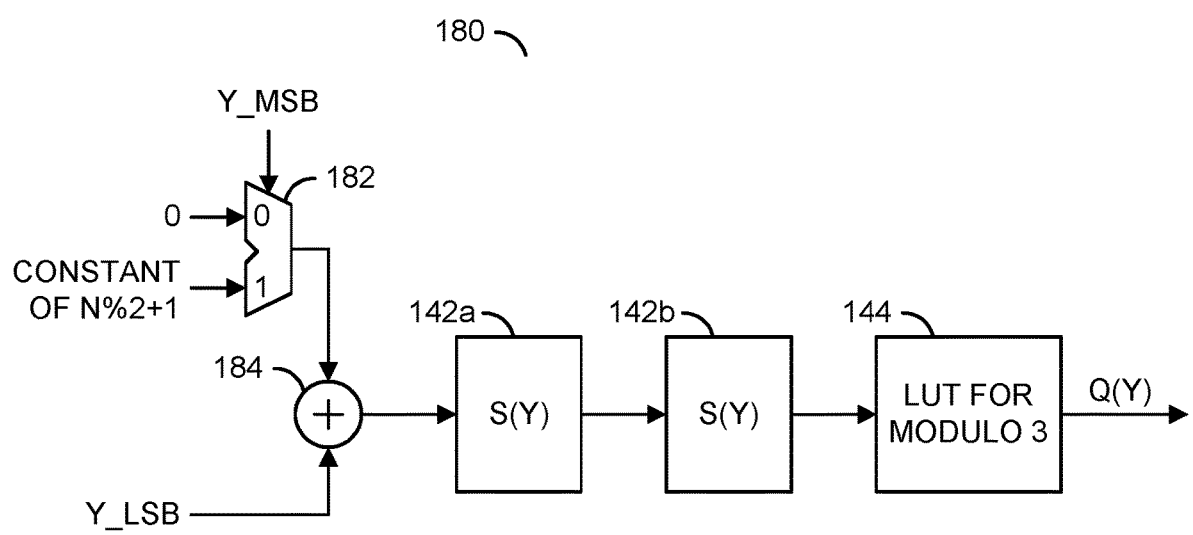
FIG. 6 is a diagram of another translation circuit in accordance with an embodiment of the invention.

Referring to FIG. 6, a diagram of an example implementation of a translation circuit 180 is shown in accordance with an embodiment of the invention. The translation circuit 140 may be representative of the translation circuits 102a-102b and 108. The translation circuit 140 generally comprises a multiplexer 182, an addition circuit 184, the summation circuits 142a-142b and the LUT 144. The value Y_MSB may be received at a control input of the multiplexer 182. A constant value of zero may be received at an input of the multiplexer 182. A constant value of N mod 2+1 (noted as N %2+1 in the figure) may be received at another input of the multiplexer 182. An output of multiplexer 182 may be received by the addition circuit 184. The least significant bits Y_LSB may also be received by the addition circuit 184. A sum value generated by the addition circuit 184 may be presented to the translation circuit 142a.

Assuming Q( ) is defined for negative numbers and enforce the arithmetic properties, thus the behavior Q( ) may obey equation 21 as follows:

$$Q(0) = 0$$

$$= Q(A - A)$$

$$= Q(A + (-A))$$

$$= (Q(A) + Q(-A)) \bmod 3 \qquad (21)$$

The value Q(−A) may be defined by equation 22 as follows:

$$Q(-A) = (3 - Q(A)) \bmod 3 \qquad (22)$$

Negative numbers may commonly be represented by the two's complement of a positive number. Let Y be an N-bit two's complement number. Let the sign bit of Y be Y_MSB, and the rest of the bits be a positive number Y_LSB. Therefore, Q(Y)=Q(Y_LSB) when Y is positive. When Y is negative, Q(Y) may be calculated by equation 23 as follows:

$$Q(Y) = (Q(Y\_LSB) + Q(-2^{N-1})) \bmod 3$$

$$= (Q(Y\_LSB) + (3 - Q(2))) \bmod 3 \text{ if } N \text{ is even}$$

$$= (Q(Y\_LSB) + (3 - Q(1))) \bmod 3 \text{ if } N \text{ is odd}$$

$$= (Q(Y\_LSB) + (N \bmod 2) + 1) \bmod 3 \qquad (23)$$

Factor in the positive case, the checker function for a two's complement number may be provided by equation 24 as follows:

$$Q(Y) = Q(Y\_LSB) \text{ if } Y\_MSB = 0$$

$$= (Q(Y\_LSB) + (N \bmod 2) + 1) \bmod 3 \text{ if } Y\_MSB = 1 \qquad (24)$$

Note that the sign bit Y_MSB may still participate in the checker function, in that a different calculation may utilized based on the value Y_MSB.

If the bit-flipping happens in Y_LSB, Q(Y_LSB) may change value. If the bit-flipping happens in Y_MSB, since the term (N mod 2)+1 is never zero, the value Q(Y) may always change in value. For ease of implementation, equation 24 may be factored into equation 25 as follows:

$$Q(Y) = Q(Y\_LSB + (Y\_MSB?((N \bmod 2) + 1) : 0)) \qquad (25)$$

Where the operation A?B:C means return B if A is true, else return C (e.g., implemented by the multiplexer 182 in FIG. 6).

For subtraction, equation 22 may be rewritten as equation 26 as follows:

$$Q(A-B)=Q(A+(-B))$$

$$=(Q(A)+Q(-B)) \bmod 3$$

$$=(Q(A)+3-Q(B)) \bmod 3$$

$$=(Q(A)-Q(B)) \bmod 3 \qquad (26)$$

Note that the subtraction on the right-hand side is a modulo 3 subtraction. In various implementations, the value (Q(A)+3−Q(B)) mod 3 may be implemented in the LUT 144 instead of the value (Q(A)−Q(B)) mod 3.

Referring again to FIG. 2, after applying the translation Q( ) to in the values in the signals A and B, the resulting values in the signals D and E may be mapped by the function Z( ) to arrive at Q(Y). The mapping function Z( ) generally depends on how the value Y is calculated in the function circuit 84. In various embodiments, the way that the value Y in the signal CIN is calculated from the values in the signals A and B may be the same way that the value Q(Y) is calculated from Q(A) and Q(B).

Let p(A, B, C, . . . ) be a polynomial function. Therefore, p( ) may be calculated with only additions, subtractions, and multiplications. If the circuit 84 is designed to calculate Y=p(A, B, C, . . . ), by equations 6, 17 and 26 the polynomial p( ) may be calculated by equation 27 as follows:

$$Q(Y)=p(Q(A),Q(B),Q(C), \ldots ) \bmod 3 \qquad (27)$$

Figure 7:
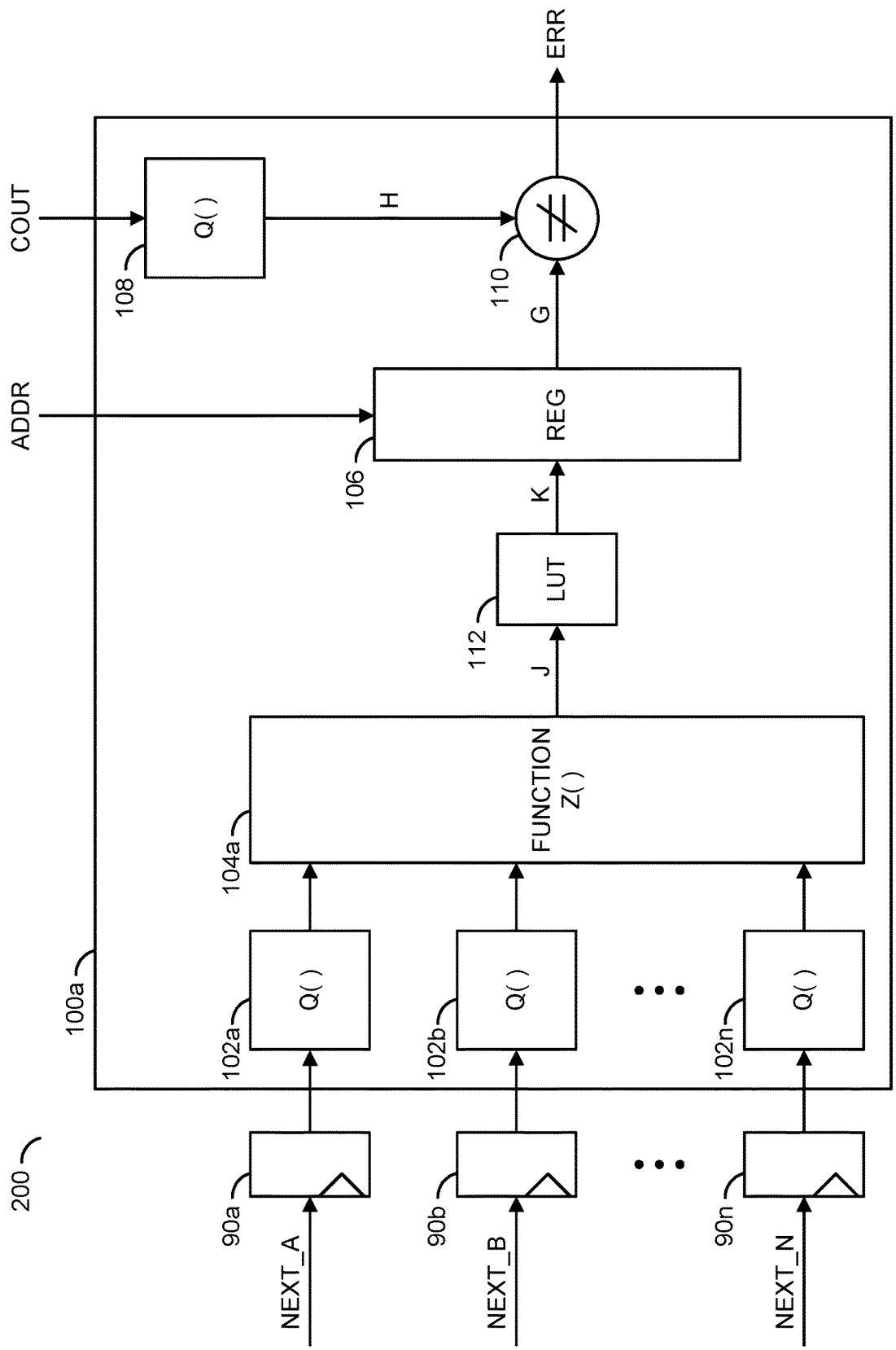
FIG. 7 is a diagram 200 of another checker circuit in accordance with an embodiment of the invention.

Referring to FIG. 7, a diagram 200 of an example implementation of a checker circuit 100a is shown in accordance with an embodiment of the invention. The checker circuit 100a may be a variation of the checker circuit 100. Multiple registers 90a-90n may buffer the next values (e.g., NEXT_A to NEXT_N) to be processed by the checker circuit 100a. The checker circuit 100a generally comprises multiple translation circuits 102a-102n, a function circuit 104a, the registers 106, the translation circuit 108, the comparison circuit 110 and a lookup table 112.

A signal (e.g., J) may be generated by the function circuit 104a and received by the LUT 112. The signal J may carry an expanded intermediate check value based on the input check values generated by the translation circuits 102a-102n. A signal (e.g., K) may be generated by the LUT 112 and presented to the registers 106. The signal K may carry the intermediate check value based on the expanded check value in the signal J.

The function circuit 104a may be a variation of the function circuit 104. In various embodiments, the function circuit 104a may treat each input data value as a coefficient (e.g., Q(A), Q(B), Q(C), . . . ) of the polynomial p( ). The resulting values (e.g., Z(Q(A)), Z(Q(B)), Z(Q(C)), . . . ) generated for each component may be presented to the LUT 112. The LUT 112 may store values to perform the modulo 3 operation of equation 27 on the resulting values to determine the value Q(Y) in the signal K.

Some changes to equation 3 may still meet the criteria that equations 6, 17 and 26 are true, and that single-bits errors may be detected. A generic form of the family of checker functions may be provided by equation 28 as follow:

$$Q_{(m,t)}(Y) = \left( \sum_{i=0}^{N} ((-1)^{t \lfloor i/m \rfloor} \times 2^{i \% m} \times y_i) \right) \% (2^m + 2t - 1) \qquad (28)$$

Where % may represent the modulo operation and $\lfloor X \rfloor$ may be a floor operator that returns the largest integer value less than or equal to X. If the number Y is parsed into chunks of m-bits each, if t=0, add up all the chunks. Otherwise if t=1, add up the even chunks and the odd chunks separately, and calculate the difference of the two sums. Thereafter, calculate a modulo equivalence in base $2^m+2t-1$. Some examples calculations may be provided in equations 29, 30 and 31 as follows:

$$Q_{(2,1)}(Y) = \left( \sum_{i=0}^{\lceil N/4 \rceil -1} (-2y_{4i+3} - y_{4i+2} + 2y_{4i+1} + y_{4i}) \right) \bmod 5 \qquad (29)$$

Where m=2 and t=1.

$$Q_{(3,0)}(Y) = \left( \sum_{i=0}^{\lceil N/3 \rceil -1} (4y_{3i+2} + 2y_{3i+1} + y_{3i}) \right) \bmod 7 \qquad (30)$$

Where m=3 and t=0.

$$Q_{(3,1)}(Y) = \qquad (31)$$

$$\left( \sum_{i=0}^{\lceil N/6 \rceil -1} (-4y_{6i+5} - 2y_{6i+4} - y_{6i+3} + 4y_{6i+2} + 2y_{6i+1} + y_{6i}) \right) \bmod 9$$

Where m=3 and t=1. Equation 3 may cover the case where m=2 and t=0.

Figure 8:
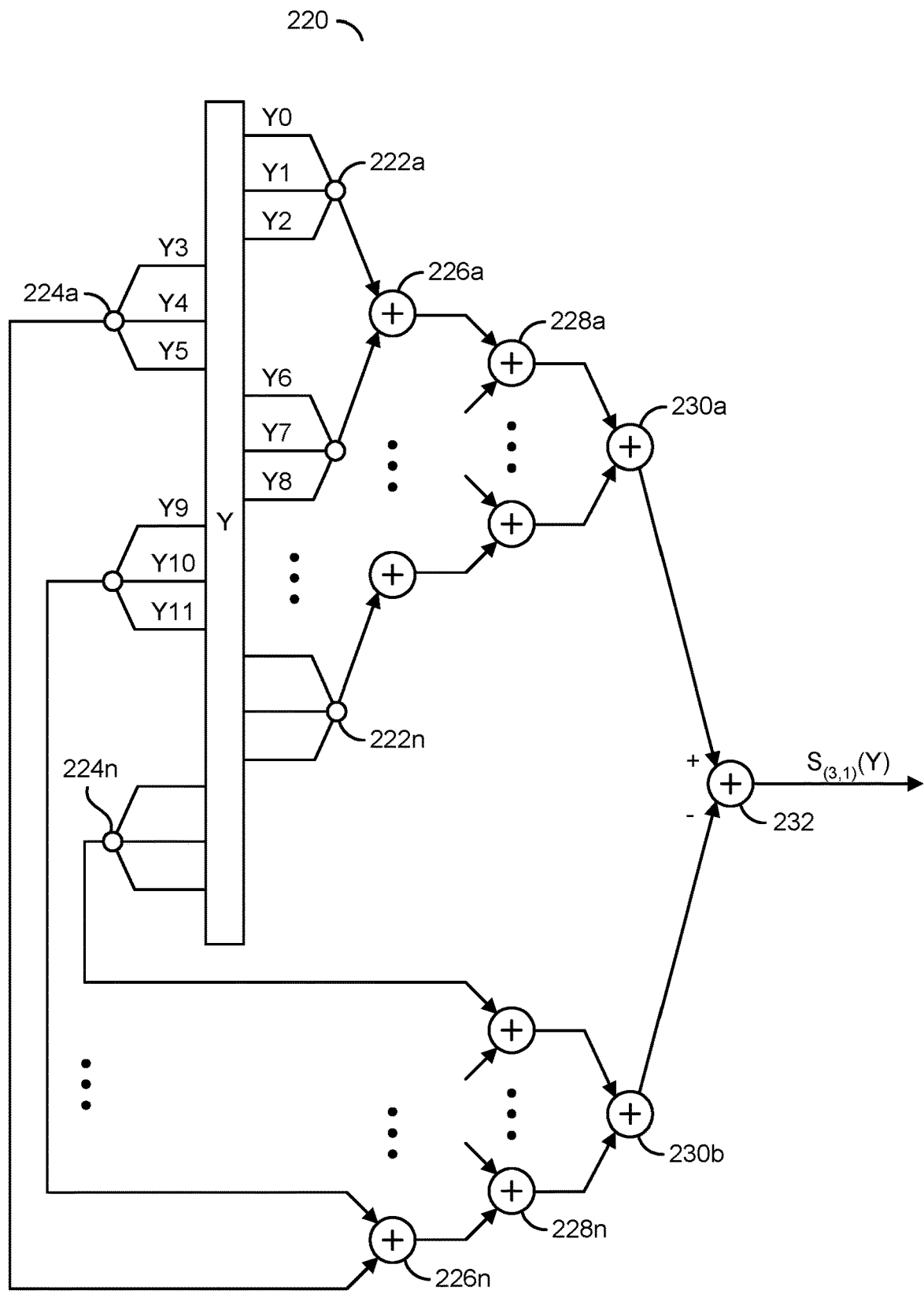
FIG. 8 is a diagram of another summation circuit in accordance with an embodiment of the invention.

Referring to FIG. 8, a diagram of an example implementation of a summation circuit 220 is shown in accordance with an embodiment of the invention. The summation circuit 220 may be a variation of the summation circuit 120. One or more copies of the summation circuit 220 may be used in implementing the translation circuits 102a-102n and 108. The summation circuit 220 generally comprises multiple concatenation circuits 222a-222n, multiple concatenation circuits 224a-224n, multiple addition circuits 226a-226n, multiple addition circuits 228a-228n, multiple addition circuits 230a-230b and an addition circuit 232. The summation circuit 220 may implement a case where m=3 and t=1 (equation 31).

The number Y may be parsed into chunks of 3 bits. As illustrated, the bits Y0-Y2 may be parsed into an initial chunk, the bits Y3-Y5 may be parsed into a next chunk, the bits Y6-Y8 may be parsed into another chunk, and so on. A sum of all even chunks may be calculated by the concatenation circuits 222a-222n and the layers of addition circuits 222a-230a. A sum of all odd chunks may be calculated by the concatenation circuits 224a-224n and the layers of addition circuits 222a-230b. The odd sum may be subtracted from the even sum by the addition circuit 232 to generate the value $S_{(3,1)}(Y)$.

Figure 9:
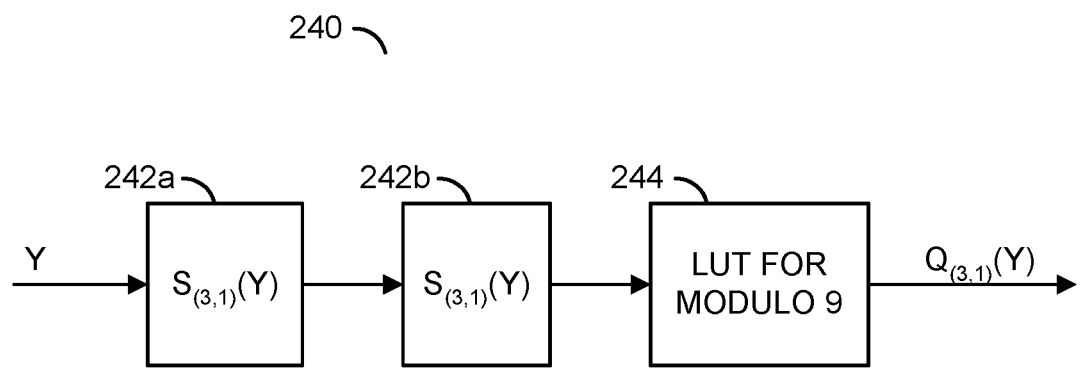
FIG. 9 is a diagram of still another translation circuit in accordance with an embodiment of the invention.

Referring to FIG. 9, a diagram of an example implementation of a translation circuit 240 is shown in accordance with an embodiment of the invention. The translation circuit 240 may be representative of the translation circuits 102a-102n and 108. The translation circuit 240 generally comprises one or more (e.g., 2) summation circuits 242a-242b and a lookup table (LUT) 244. Each summation circuit 242a-242b may be an instantiation (or copy) of the summation circuit 220. The value Y may be received by the summation circuit 242a. A check value $Q_{(3,1)}(Y)$ may be generated by the LUT 244.

As illustrated, two summation circuits 242a-242b may be cascaded in series to reduce the size of the lookup table in the LUT 244. The lookup table may contain data for the modulo 9 operation in equation 31. Depending on the bit-width of the value Y, a single summation circuit 242a may be implemented for smaller bit widths and more than two summation circuits 242a-242b may be implemented for larger bit widths.

Figure 10:
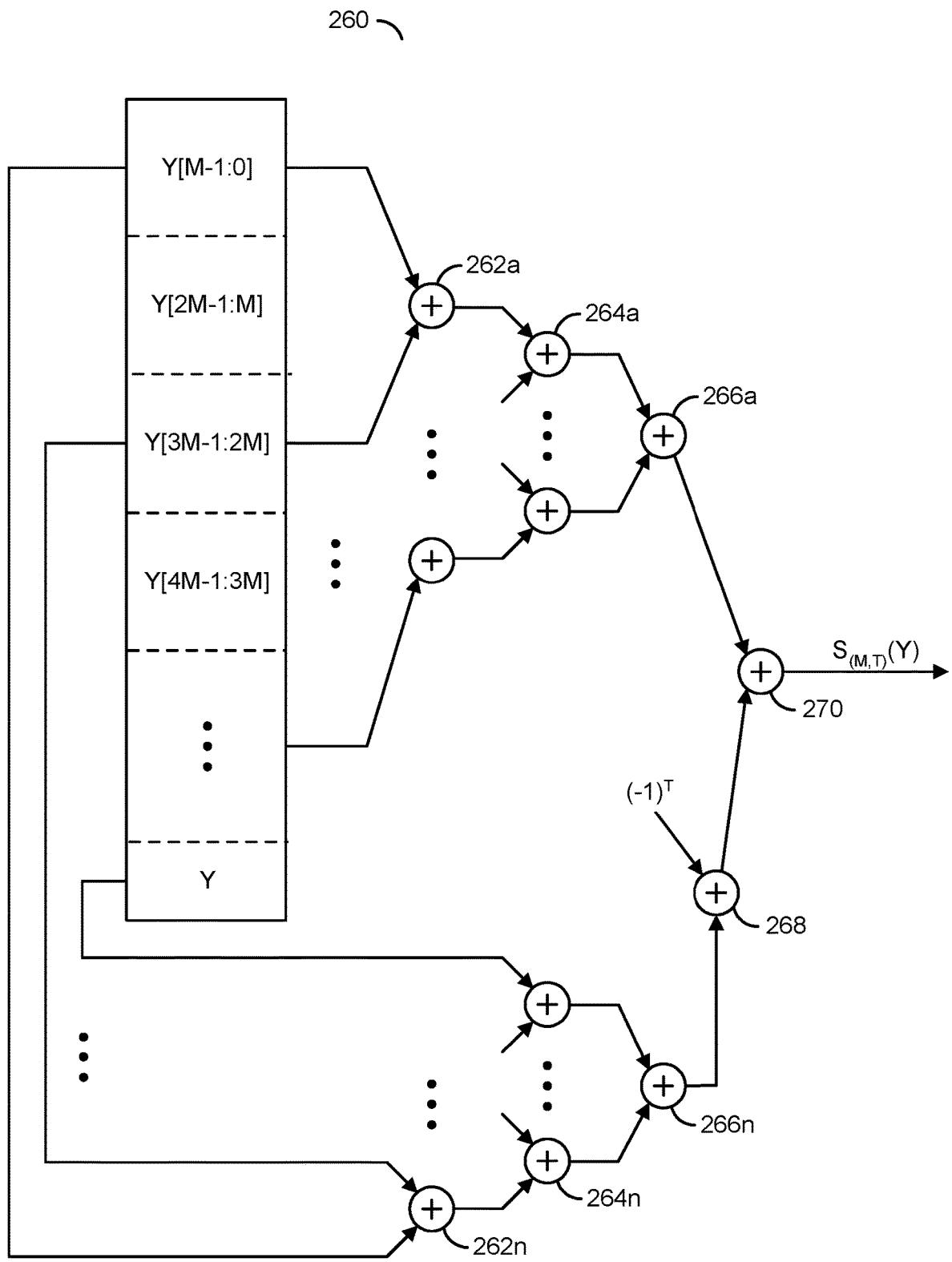
FIG. 10 is a diagram of still another summation circuit in accordance with an embodiment of the invention.

Referring to FIG. 10, a diagram of an example implementation of a summation circuit 260 is shown in accordance with an embodiment of the invention. The summation circuit 260 may be a variation of the summation circuits 120 and/or 220. One or more copies of the summation circuit 260 may be used in implementing the translation circuits 102a-102n and 108. The summation circuit 260 generally comprises multiple layers of addition circuits 262a-270. The addition circuit 270 may generate and present the value $S_{(m,t)}(Y)$.

In a generic case of a given m and t, the number Y may be parsed into chunks of m bits. For example, the parsing may create an initial chunk Y[M−1:0], a next chunk Y[2M−1:M], another chunk Y[3M−1:2M], and so on. The sum of all even chunks and the sum of all odd chunks may be calculated by the layers of addition circuits 262a-268. If t is 0, the two sums may be added together by the addition circuit 270 to generate the value $S_{(m,t)}(Y)$. If t is 1, the odd sum may be subtracted from the even sum by the addition circuit 270 to generate the value $S_{(m,t)}(Y)$. Generally, value $S_{(m,t)}(Y)$ may be calculated as the "even sum"+$((-1)^t \times$"odd sum"), where $(-1)^0=1$ (add odd sum to even sum) and $(-1)^1=-1$ (subtract odd sum from even sum).

Figure 11:
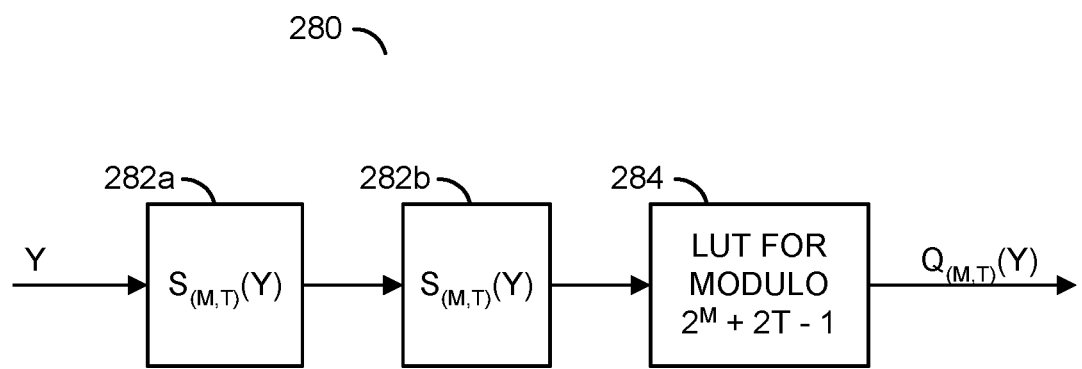
FIG. 11 is a diagram of another translation circuit in accordance with an embodiment of the invention.

Referring to FIG. 11, a diagram of an example implementation of a translation circuit 280 is shown in accordance with an embodiment of the invention. The translation circuit 280 may be representative of the translation circuits 102a-102n and 108. The translation circuit 280 generally comprises one or more (e.g., 2) summation circuits 282a-282b and a lookup table (LUT) 284. Each summation circuit 282a-2482b may be an instantiation (or copy) of the summation circuit 260. The value Y may be received by the summation circuit 282a. A check value $Q_{(m,t)}(Y)$ may be generated by the LUT 284 by programming a final modulo $2^m+2t-1$ operation in the data of the LUT 284. As illustrated, two summation circuits 282a-282b may be implemented to reduce the size of the lookup table in the LUT 284. The lookup table may contain data for the modulo operation in equation 28. Depending on the bit-width of the value Y, a single summation circuit 282a may be implemented for smaller bit widths and more than two summation circuits 282a-282b may be implemented for larger bit widths.

Figure 12:
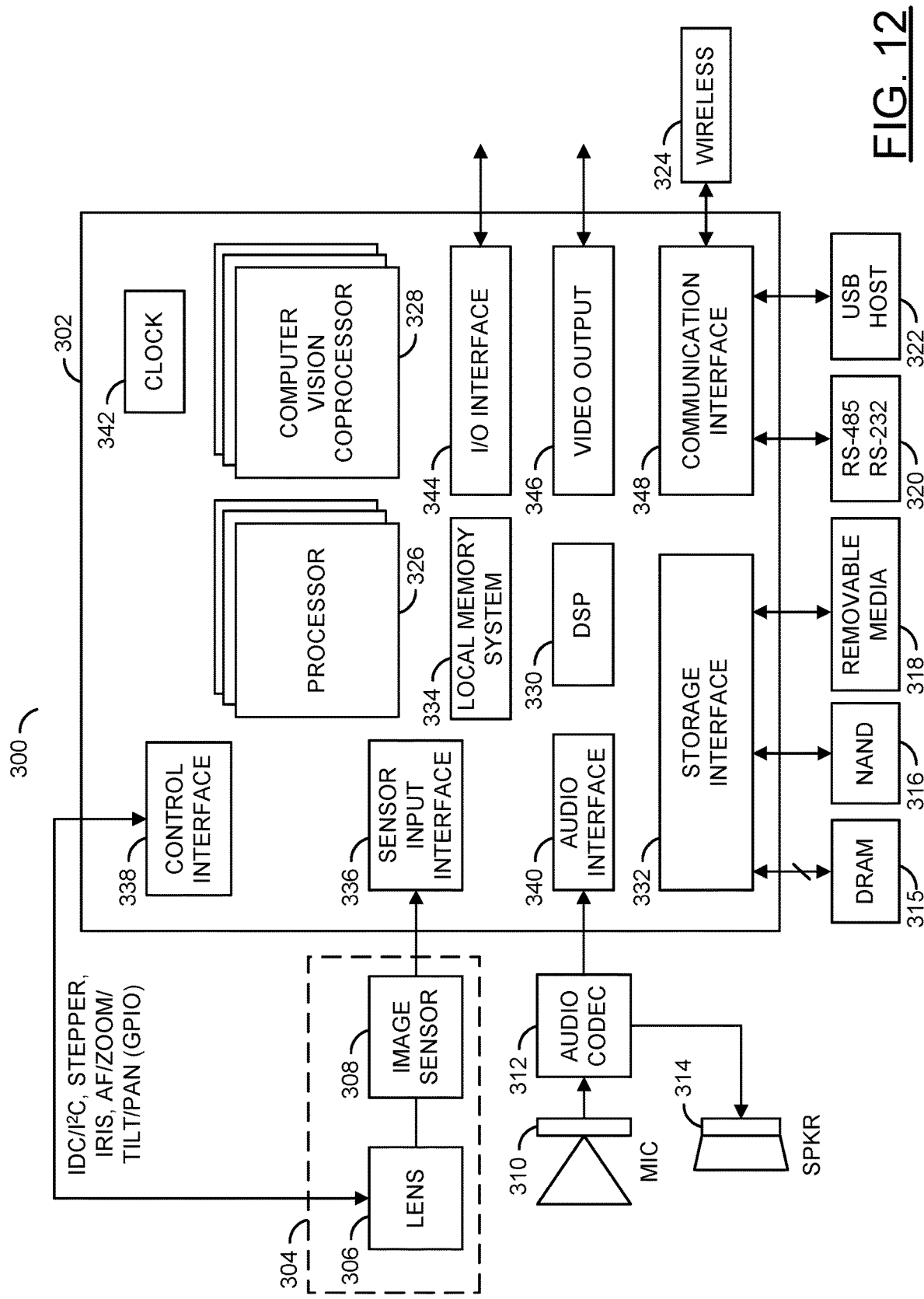
FIG. 12 is a diagram of a camera system in accordance with an embodiment of the invention.

Referring to FIG. 12, a diagram of an example implementation of a camera system 300 is shown in accordance with an embodiment of the invention. In one example, the electronics of the camera system 300 may be implemented as one or more integrated circuits. For example, an application specific integrated circuit (ASIC) or system on chip (SOC) may be used to implement the camera system 300.

In one example, the camera system 300 may comprise the DRAM circuit 86, a processor/camera chip (or circuit) 302, a block (or assembly) 304 having a block 306 and one or more blocks (or circuits) 308, a block (or circuit) 310, a block (or circuit) 312, a block (or circuit) 314, a block (or circuit) 315, a block (or circuit) 316, a block (or circuit) 318, a block (or circuit) 320, a block (or circuit) 322 and a block (or circuit) 324. The circuits 86 and 304-324 may be connectable to the camera circuit 302.

In various embodiments, the camera circuit 302 may comprise one or more blocks (or circuits) 326, one or more blocks (or circuits) 328, a block (or circuit) 330, a block (or circuit) 332, a block (or circuit) 334, a block (or circuit) 336, a block (or circuit) 338, a block (or circuit) 340, a block (or circuit) 342, a block (or circuit) 344, a block (or circuit) 346 and a block (or circuit) 348. The circuits 326 through 348 may be connected to each other using one or more buses, traces, protocols, etc.

The circuit 304 may implement a lens and sensor assembly. The lens and sensor assembly 304 is shown connected to the camera circuit 302. In some embodiments, the lens and sensor assembly 304 may be a component of the camera circuit 302 (e.g., a SoC component). In some embodiments, the lens and sensor assembly 304 may be a separate component from the camera circuit 302 (e.g., the lens and sensor assembly may be an interchangeable component compatible with the camera circuit 302). In some embodiments, the lens and sensor assembly 304 may be part of a separate camera connected to the processing portion of the circuit 302 (e.g., via a video cable, a high definition media interface (HDMI) cable, a universal serial bus (USB) cable, an Ethernet cable, or wireless link). The lens and sensor assembly 304 may comprise other components (not shown). The number, type and/or function of the components of the lens and sensor assembly 304 may be varied according to the design criteria of a particular application.

The block 306 may implement a lens 306. The lens 306 may capture and/or focus light input received from the environment near the camera 300. The lens 306 may capture and/or focus light for the circuit 308. The lens 306 may be implemented as an optical lens. The lens 306 may provide a zooming feature and/or a focusing feature. The lens and sensor assembly 304 may be implemented with additional circuitry (e.g., motors) to adjust a direction, zoom and/or aperture of the lens 306. The lens 306 may be directed, tilted, panned, zoomed and/or rotated to provide a targeted view of the environment near the camera 300.

The circuit 308 may implement an image sensor. The image sensor 308 may receive light from the lens 306. The image sensor 308 may be configured to transform the received focused light into digital data (e.g., bitstreams). In some embodiments, the image sensor 308 may perform an analog to digital conversion. For example, the image sensor 308 may perform a photoelectric conversion of the focused light received from the lens 306. The image sensor 308 may present the converted image data as a color filter array (CFA) formatted bitstream. The camera circuit 302 may transform the bitstream into video data, video files and/or video frames (e.g., human-legible content).

The circuit 310 may be a microphone for capturing audio. The circuit 312 may be an audio codec for recording audio in a particular format. The circuit 314 may be a speaker for playing audio.

The circuit 315 may implement a dynamic random access memory (DRAM) circuit. The DRAM circuit 315 is generally operational to store input data elements and various forms of output data elements. The DRAM circuit 315 may exchange the input data elements and the output data elements with the circuits 326, the circuits 328 and the circuit 330.

The circuit 316 may implement a nonvolatile memory (e.g., NAND flash memory, NOR flash memory, etc.). The circuit 318 may implement a removable media 318 (e.g., secure digital media (SD), secure digital extended capacity media (SDXC), etc.). The circuit 320 may implement one or more serial communication channels 320 (e.g., RS-485, RS-232, etc.). The circuit 322 may implement one or more universal serial bus (USB) hosts 322 and/or USB interfaces. The circuit 324 may implement wireless interface for communicating with a user device (e.g., a smart phone, a computer, a tablet computing device, cloud resources, etc.). In various embodiments, the wireless interface 324 and/or the USB Host 322 may be configured for communicating with a camera controller wirelessly. In the embodiment shown, the circuits 304-324 are implemented as components external to the camera circuit 302. In some embodiments, the circuits 304-324 may be components on-board the camera circuit 302.

Each circuit 326 may implement a processor circuit. When programming code (or software or instructions) are executed by the processors 326, the programming code generally causes one or more components in the processor/camera circuit 302 to configure video synchronization operations and start video frame processing operations. The resulting compressed video signal may be presented to the storage interface 332, the video output 346 and/or the communication module 348.

Each circuit 328 may implement a computer vision coprocessor circuit. The coprocessor circuit 328 is generally operational to perform specific (e.g., computer vision related) processing tasks as arranged by the processor circuits 326. In various embodiments, the coprocessors 328 may be implemented solely in hardware. The coprocessors 328 may directly execute one or more data flows generated by software that specifies processing tasks.

The circuit 330 may be a digital signal processing (DSP) module. In some embodiments, the circuit 330 may implement separate image DSP and video DSP modules. The DSP module 330 may be configured to process digital signals. The DSP module 330 may comprise an image digital signal processor (IDSP), a video digital signal processor DSP (VDSP) and/or an audio digital signal processor (ADSP). The DSP module 330 may be configured to receive information (e.g., pixel data values captured by the image sensor 308) from the circuit 336. The DSP module 330 may be configured to determine the pixel values (e.g., RGB, YUV, luminance, chrominance, etc.) from the information received from the sensor input 336. The DSP module 330 may be further configured to support or provide a sensor RGB to YUV raw image pipeline to improve image quality, bad pixel detection and correction, demosaicing, white balance, color and tone correction, gamma correction, adjustment of hue, saturation, brightness and contrast adjustment, chrominance and luminance noise filtering.

The circuit 332 may be a storage interface. The storage interface 332 may be configured to manage one or more types of storage and/or data access. In one example, the storage interface 332 may implement a direct memory access (DMA) engine and/or a graphics direct memory access (GDMA). In another example, the storage interface 332 may implement a secure digital (SD) card interface (e.g., to connect to the removable media 318).

The circuit 334 may implement a local memory system (e.g., cache, fast random access memory, etc.). In various embodiments, programming code (e.g., executable instructions for controlling various processors and encoders of the camera circuit 302) may be stored in one or more of the memories (e.g., the DRAM circuit 86, the NAND 316, etc.). When executed by the processor circuit 82, the programming code generally causes one or more components in the camera circuit 302 to configure video synchronization operations and start video frame processing operations. The resulting compressed video signal may be presented to the storage interface 332, the video output 346 and/or the communication module 348. The storage interface 332 may transfer program code and/or data between external media (e.g., the DRAM circuit 86, the NAND 316, the removable media 318, etc.) and the local (internal) memory system 334.

The circuit 336 may implement a sensor input (or interface). The sensor input 336 may be configured to send/receive data to/from the image sensor 308. In one example, the sensor input 336 may comprise an image sensor input interface. The sensor input 336 may be configured to transmit captured images (e.g., light data) from the image sensor 308 to the DSP module 330 and/or the processor circuits 82. The data received by the sensor input 336 may be used by the DSP 330 to determine a luminance (Y) and chrominance (U and V) values from the image sensor 308. The sensor input 336 may provide an interface to the lens and sensor assembly 304. The sensor input 336 may enable the camera circuit 302 to capture image data from the lens and sensor assembly 304.

The circuit 338 may implement one or more control interfaces including but not limited to an inter device communication (IDC) interface, an inter integrated circuit ($I^2C$) interface, a serial peripheral interface (SPI), and a pulse width modulation (PWM) interface. The control interface 338 may be configured to generate signals (e.g., IDC/I2C, STEPPER, IRIS, AF/ZOOM/TILT/PAN, etc.) for controlling the lens and sensor assembly 304. The signal IRIS may be configured to adjust an iris for the lens and sensor assembly 304. The control interface 338 may enable the camera circuit 302 to control the lens and sensor assembly 304.

The circuit 340 may implement an audio interface (e.g., an $I^2S$ interface, etc.). The audio interface 340 may be configured to send/receive audio data. In one example, the audio interface 340 may implement an audio inter-IC sound (I'S) interface. The audio interface 340 may be configured to send/receive data in a format implemented by the audio codec 312. The circuit 342 may implement a clock circuit including but not limited to a real time clock (RTC), a watchdog timer (WDT), and/or one or more programmable timers.

The circuit 344 may implement an input/output (I/O) interface. The I/O interface 344 may be configured to send/receive data. The data sent/received by the I/O interface 344 may be miscellaneous information and/or control data. In one example, the I/O interface 344 may implement a general purpose input/output (GPIO) interface. In another example, the I/O interface 344 may implement an analog-to-digital converter (ADC) module and/or digital-to-analog converter (DAC) module. In yet another example, the I/O interface 344 may implement an infrared (IR) remote interface. In still another example, the I/O interface 344 may implement one or more synchronous data communications interfaces (IDC SPI/SSI).

The circuit 346 may be a video output module. The video output module 346 may be configured to send video data. For example, the camera 300 may be connected to an external device (e.g., a TV, a monitor, a laptop computer, a tablet computing device, etc.). The video output module 346 may implement a high-definition multimedia interface (HDMI), an LCD/TV/Parallel interface and/or a DisplayPort interface. The video data may be presented in one or more formats (e.g., PAL, NTSC, VGA, WVGA, QVGA, SD, HD, Ultra HD, 4K, etc.).

The circuit 348 may be a communication module. The communication module 348 may be configured to send/receive data. The data sent/received by the communication module 348 may be formatted according to a particular protocol (e.g., Bluetooth, USB, Wi-Fi, UART, etc.). In one example, the communication module 348 may implement a secure digital input output (SDIO) interface. The communication module 348 may include support for wireless communication by one or more wireless protocols such as Bluetooth®, ZigBee®, Institute of Electrical and Electronics Engineering (IEEE) 802.11, IEEE 802.15, IEEE 802.15.1, IEEE 802.15.2, IEEE 802.15.3, IEEE 802.15.4, IEEE 802.15.5, IEEE 802.20, GSM, CDMA, GPRS, UMTS, CDMA2000, 3GPP LTE, 4G/HSPA/WiMAX and/or SMS. The communication module 348 may also include support for communicating using one or more of the universal serial bus protocols (e.g., USB 1.0, 2.0, 3.0, etc.). The camera circuit 302 may also be configured to be powered via a USB connection. However, other communication and/or power interfaces may be implemented accordingly to meet the design criteria of a particular application.

Copies of the invention may be implemented in the coprocessors 328 and/or the DSP 330. In various embodiments, the invention may protect only the control paths. In other embodiments, the invention may protect the data paths. The invention may be implemented in other circuits (e.g., the processors 326) to meet the design criteria of a particular application.

The functions performed by the diagrams of FIGS. 1-12 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROMs (ultra-violet erasable programmable ROMs), Flash memory, magnetic cards, optical cards, and/or any type of media suitable for storing electronic instructions.

The elements of the invention may form part or all of one or more devices, units, components, systems, machines, virtual machines and/or apparatuses. The devices may include, but are not limited to, servers, workstations, storage array controllers, storage systems, personal computers, laptop computers, notebook computers, palm computers, cloud servers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a plurality of translation circuits configured to generate (i) a plurality of first check values by translating a plurality of input values into a codomain, and (ii) a second check value by translating an output value read from a first memory into said codomain, wherein (a) said output value is a function of said input values, and was previously generated by performing a predefined arithmetic operation on said input values and storing a result of said predefined arithmetic operation in said first memory, and (b) a translation performed by said translation circuits has a first property that all single-bit errors are detectable and a second property that the first property is preserved under addition and multiplication of values translated into said codomain;
   a logic circuit configured to generate a third check value in said codomain by performing said predefined arithmetic operation on said first check values; and a comparison circuit configured to generate an error signal in response to a mismatch in a comparison of said second check value with said third check value, wherein said error signal indicates detection of a corruption between said result that was stored in said first memory and said output value read from said first memory.

2. The apparatus according to claim 1, wherein (i) said input values and said output value reside in a domain larger than said codomain and (ii) said codomain has three elements.

3. The apparatus according to claim 1, further comprising a register configured to store said third check value.

4. The apparatus according to claim 1, wherein each of said translation circuits comprises a plurality of summation circuits (i) connected in series and (ii) configured to generate a first sum value.

5. The apparatus according to claim 4, wherein each of said translation circuits further comprises a lookup table configured to generate a second sum value in said codomain by performing a modulus operation of said first sum value.

6. The apparatus according to claim 4, wherein each of said summation circuits comprises a plurality of concatenation circuits configured to generate a plurality of concatenated bits by concatenating a respective set of two bits in one among said input values and said output value.

7. The apparatus according to claim 6, wherein each of said summation circuits further comprises a plurality of addition circuits configured to generate said first sum value by adding said concatenated bits.

8. The apparatus according to claim 1, wherein (i) said output value is generated and stored in said first memory, and (ii) said third check value is generated and stored in a second memory in parallel.

9. The apparatus according to claim 1, wherein said function comprises a polynomial function.

10. A method for soft-error detection, comprising the steps of:
generating a plurality of first check values by translating a plurality of input values into a codomain using a circuit;
generating a second check value by translating an output value read from a first memory into said codomain, wherein (a) said output value is a function of said input values, and was previously generated by performing a predefined arithmetic operation on said input values and storing a result of said predefined arithmetic operation in saki first memory, and (b) a translation performed to obtain said plurality of first check values and said second check value has a first property that all single-bit errors are detectable and a second property that the first property is preserved under addition and multiplication of values translated into said codo main;
generating a third check value in said codomain by performing said predefined arithmetic operation on said first check values; and
generating an error signal in response to a mismatch in a comparison of said second check value with said third check value, wherein said error signal indicates detection of a corruption between said result that was stored in said first memory and said output value read from said first memory.

11. The method according to claim 10, wherein (i) said input values and said output value reside in a domain larger than said codomain and (ii) said codomain has three elements.

12. The method according to claim 10, further comprising the step of:
storing said third check value in a second memory.

13. The method according to claim 10, wherein each of said translations comprises a plurality of summations (i) performed in series and (ii) configured to generate a first sum value.

14. The method according to claim 13, wherein each of said translations further comprises generating a second sum value in said codomain by performing a modulus operation of said first sum value.

15. The method according to claim 13, wherein each of said summations comprises a plurality of concatenations configured to generate a plurality of concatenated bits by concatenating a respective set of two bits in one among said input values and said output value.

16. The method according to claim 15, wherein each of said summations further comprises a plurality of additions configured to generate said first sum value by adding said concatenated bits.

17. The method according to claim 10, wherein (i) said output value is generated and stored in said first memory, and (ii) said third check value is generated and stored in a second memory in parallel.

18. The method according to claim 10, wherein said function comprises a polynomial function.

* * * * *